(12) United States Patent
Bae

(10) Patent No.: US 8,846,444 B2
(45) Date of Patent: Sep. 30, 2014

(54) SEMICONDUCTOR PACKAGE AND METHOD FOR MANUFACTURING THE SAME

(75) Inventor: Jin Ho Bae, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 453 days.

(21) Appl. No.: 13/228,591

(22) Filed: Sep. 9, 2011

(65) Prior Publication Data
US 2012/0061843 A1    Mar. 15, 2012

(30) Foreign Application Priority Data
Sep. 13, 2010  (KR) .................. 10-2010-0089594

(51) Int. Cl.
H01L 21/00 (2006.01)
H01L 21/44 (2006.01)
H01L 23/14 (2006.01)
H01L 21/48 (2006.01)
H01L 23/00 (2006.01)
H01L 23/31 (2006.01)
H01L 23/498 (2006.01)

(52) U.S. Cl.
CPC ......... *H01L 24/75* (2013.01); *H01L 2224/2919* (2013.01); *H01L 2924/0102* (2013.01); *H01L 2924/01033* (2013.01); *H01L 2924/1579* (2013.01); *H01L 2924/1431* (2013.01); *H01L 2924/01042* (2013.01); *H01L 2924/15311* (2013.01); *H01L 24/06* (2013.01); *H01L 2924/01028* (2013.01); *H01L 2224/73265* (2013.01); *H01L 2924/01023* (2013.01); *H01L 23/3128* (2013.01); *H01L 23/145* (2013.01); *H01L 2924/01015* (2013.01); *H01L 2924/0001* (2013.01); *H01L 2924/01078* (2013.01); *H01L 2924/01056* (2013.01); *H01L 2924/01029* (2013.01); *H01L 2924/01013* (2013.01); *H01L 2924/01024* (2013.01); *H01L 2924/01074* (2013.01); *H01L 2924/01079* (2013.01); *H01L 2924/0103* (2013.01); *H01L 2924/0105* (2013.01); *H01L 2224/48235* (2013.01); *H01L 2224/45124* (2013.01); *H01L 23/49816* (2013.01); *H01L 2924/15165* (2013.01);
(Continued)

(58) Field of Classification Search
USPC .............................................. 438/64, 106, 598
See application file for complete search history.

(56) References Cited

U.S. PATENT DOCUMENTS 5,592,025 A * 1/1997 Clark et al. .................. 257/774
6,538,210 B2 * 3/2003 Sugaya et al. ............... 174/258
(Continued)

FOREIGN PATENT DOCUMENTS

JP     2002083900     *  3/2002
JP     2009070882 A     4/2009

*Primary Examiner* — James Mitchell
(74) *Attorney, Agent, or Firm* — William Park & Associates Patent Ltd.

(57) ABSTRACT

A semiconductor package includes a semiconductor chip having a first surface, on which an electrode pad is arranged, and a second surface which is the other side of the semiconductor chip, an insulation member formed on the second surface of the semiconductor chip, and comprising a via hole at a position spaced apart from the semiconductor chip, and a conductive filler filling the via hole.

12 Claims, 6 Drawing Sheets

(52) U.S. Cl.
CPC . *H01L 2224/04042* (2013.01); *H01L 2924/014* (2013.01); *H01L 2924/01049* (2013.01); *H01L 24/83* (2013.01); *H01L 2924/0665* (2013.01); *H01L 2924/0132* (2013.01); *H01L 2224/06135* (2013.01); *H01L 2224/83* (2013.01); *H01L 2224/45144* (2013.01); *H01L 2924/01005* (2013.01); *H01L 21/4803* (2013.01); *H01L 2224/29111* (2013.01); *H01L 2924/01047* (2013.01); *H01L 23/49827* (2013.01); *H01L 2924/01051* (2013.01); *H01L 24/48* (2013.01); *H01L 2224/48227* (2013.01); *H01L 21/486* (2013.01); *H01L 2224/32225* (2013.01); *H01L 2224/45147* (2013.01); *H01L 2224/45139* (2013.01); *H01L 24/45* (2013.01); *H01L 2924/1434* (2013.01); *H01L 2924/01006* (2013.01); *H01L 2924/01014* (2013.01); *H01L 2924/01082* (2013.01)
USPC ............................ 438/106; 438/64; 438/598

(56) References Cited

U.S. PATENT DOCUMENTS

| | | | | |
|---|---|---|---|---|
| 6,611,063 | B1* | 8/2003 | Ichinose et al. | 257/784 |
| 7,833,894 | B2* | 11/2010 | Hiatt | 438/598 |
| 7,944,034 | B2* | 5/2011 | Gerber et al. | 257/686 |
| 8,030,780 | B2* | 10/2011 | Kirby et al. | 257/774 |
| 2004/0099943 | A1* | 5/2004 | Meguro et al. | 257/701 |
| 2005/0112803 | A1* | 5/2005 | Ogata | 438/129 |
| 2005/0239237 | A1* | 10/2005 | Puschner et al. | 438/125 |
| 2007/0045857 | A1* | 3/2007 | Wark et al. | 257/773 |
| 2007/0155174 | A1* | 7/2007 | Taniguchi et al. | 438/667 |
| 2009/0146301 | A1* | 6/2009 | Shimizu et al. | 257/738 |
| 2010/0065314 | A1* | 3/2010 | Lin et al. | 174/258 |
| 2010/0072600 | A1* | 3/2010 | Gerber | 257/686 |
| 2010/0155119 | A1* | 6/2010 | Sasaoka et al. | 174/258 |
| 2011/0037170 | A1* | 2/2011 | Shinohara | 257/737 |
| 2011/0287587 | A1* | 11/2011 | Hung et al. | 438/122 |
| 2011/0316156 | A1* | 12/2011 | Pagaila et al. | 257/738 |
| 2012/0002392 | A1* | 1/2012 | Karp et al. | 361/820 |
| 2012/0056321 | A1* | 3/2012 | Pagaila et al. | 257/774 |

* cited by examiner (A)

(B)

(C)

(D)

SEMICONDUCTOR PACKAGE AND METHOD FOR MANUFACTURING THE SAME

CROSS-REFERENCES TO RELATED APPLICATIONS

The present application claims priority under 35 U.S.C 119(a) to Korean Application No. 10-2010-0089594, filed on Sep. 13, 2010, in the Korean intellectual property Office, which is incorporated herein by reference in its entirety set forth in full.

BACKGROUND

Exemplary embodiments of the present invention relate to a semiconductor package and a method for manufacturing the same, and more particularly, to a semiconductor package requiring no substrate, and a method for manufacturing the same.

Recently, semiconductor technologies to fabricate a light, slim, high-speed, multifunctional, high-performance, high-reliability product at a low cost are being developed. One of the technologies for achieving the above object is a semiconductor package technology. The semiconductor package technology is being developed to protect a semiconductor chip from external environment, and to ensure the operational reliability of the semiconductor chip by making the semiconductor chip easily mounted. A semiconductor package is manufactured through a process of attaching a semiconductor chip on a substrate, a wire bonding process, a molding process, a trimming/forming process, and so on. The semiconductor package may be manufactured in units of a semiconductor chip level or a wafer level.

The current semiconductor technology seeks submicron critical dimension (CD), millions of cells, high-speed operation, and superior heat dissipation. However, the packaging technique relatively lags behind, and the semiconductor performance is often determined by a packaging and an electrical connection rather than the performance of semiconductor itself. In practice, a large portion of a total electric signal delay in a high-speed electronic product is caused by a package induced delay occurring between chips. To solve such a problem, a semiconductor package technique is being developed from a thin small outline package (TSOP) toward a ball grid array (BGA), a chip size package (CSP), and a flip chip technique.

FIG. 1 is a cross-sectional view of a known semiconductor package. As illustrated in FIG. 1, a substrate 10, including a core 12, a contact pad 14, and a solder resist 16, is attached to a semiconductor chip 20 by using an adhesive 30, and an electrode pad 22 of the semiconductor chip 20 is bonded to the contact pad 14 by using a wire 40. Then, the resulting structure is molded with a molding agent 50.

The substrate 10 is generally referred to as a package substrate. The substrate 10 electrically connects a printed circuit board (PCB) and the semiconductor chip 20 mounted inside the package, and supports the semiconductor chip 20. However, after the semiconductor chip is attached to the substrate, warpage of the substrate may occur, and defects in a subsequent process due to the warpage of the substrate may occur. In addition, the substrate is one of a cost-increasing factor of the semiconductor package.

SUMMARY

An exemplary embodiment of the present invention is directed to a semiconductor package, which can prevent defects caused by warpage of a substrate and so on, improve the reliability of a product, and greatly reduce a unit cost of a product, and a method for manufacturing the same.

In an exemplary embodiment of the present invention, a semiconductor package includes a semiconductor chip having a first surface, on which an electrode pad is arranged, and a second surface which is the other side of the semiconductor chip, an insulation member formed on the second surface of the semiconductor chip, and including a via hole at a position spaced apart from the semiconductor chip, and a conductive filler filling the via hole.

In another exemplary embodiment of the present invention, a method for manufacturing a semiconductor package includes filling a mold with an insulation member solution, the mold including a protruding bar within a cavity, immersing a second surface of a semiconductor chip into the insulation member solution, wherein the semiconductor chip has a first surface on which an electrode pad is arranged, and the second surface which is the other side of the semiconductor chip, separating the semiconductor chip and an insulation member attached thereto from the mold, and filling a via hole of the insulation member, which is formed by the protruding bar, with a conductive filler.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
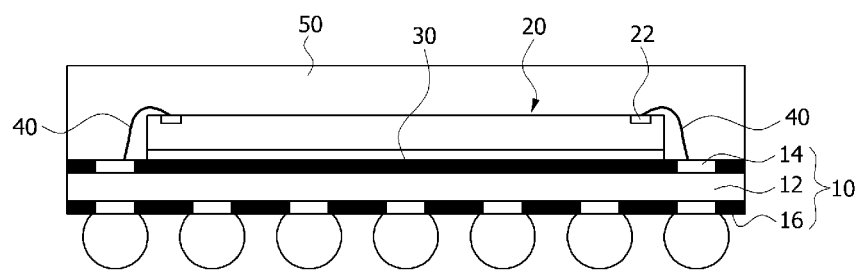
FIG. 1 is a cross-sectional view of a conventional semiconductor package.
Figure 2:
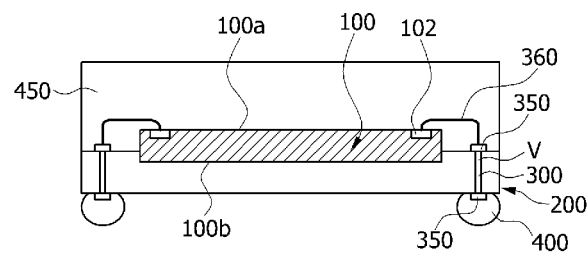
FIG. 2 is a cross-sectional view of a semiconductor package according to an exemplary embodiment of the present invention.

FIG. 2 is a cross-sectional view of a semiconductor package according to an exemplary embodiment of the present invention. Referring to FIG. 2, the semiconductor package according to the exemplary embodiment of the present invention includes a semiconductor chip 100, an insulation member 200, and a conductive filler 300. The semiconductor chip 100 has a first surface 100a on which electrode pads 102 are arranged, and a second surface 100b which is the other side of the semiconductor chip 100. The insulation member 200 is formed on the second surface 100b of the semiconductor chip 100, and includes via holes V at positions spaced apart from the semiconductor chip 100. The via holes V are filled with the conductive filler 300. In addition, the semiconductor package may further include contact pads 350, bonding wires 360, solder balls 400, and a molding agent 450.

The semiconductor chip 100 may include a semiconductor device, such as a memory device, a logic device, a photoelectric device, or a power device, and the semiconductor device may include various passive elements, such as a resistor or a capacitor.

The insulation member 200 serves as a substitute for a substrate (a package substrate). The insulation member 200 may be formed of any insulation material as long as it has an insulation property, a mechanical property, and a processability which are suitable for the semiconductor package. For example, the insulation member 200 may include at least one of an epoxy resin, an acrylic polymer, and polycarbonate, and may include a curing agent, a curing accelerator, and a filler.

The shape of the cross section of the via hole V is not specifically limited. For example, the cross section of the via hole V may be circular, oval, or rectangular. The conductive filler 300 filling the via holes V may include one or more materials selected from the group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr), molybdenum (Mo), and an alloy thereof; however, the invention is not limited thereto.

Meanwhile, although it is illustrated in FIG. 2 that the conductive filler 300 fills the entire via holed V, the conductive filler 300 may fill the via hole V in a hollow shape, or may fill only a portion of the via hole V. The contact pad 350 may be arranged at an end or both ends of the via hole V. The contact pad 350 and the conductive filler 300 may be formed of the same or different material in the same or different manner.

The bonding wire 360 may be a wire which electrically connects the electrode pad 102 of the semiconductor chip to the conductive filler 300 or the contact pad 350 formed on the conductive filler, and may include gold (Au), silver (Ag), copper (Cu), or aluminum (Al); however, the invention is not limited thereto. The gold (Au) is a chemically stable metal and can form a ball in the atmosphere without surface oxidation, but its price is high. A copper wire, a gold-silver wire, and an aluminum wire have a lower electrical conductivity than that of a gold wire, but it price is low.

The molding agent 450 may be an epoxy molding compound (EMC). The insulation member 200 and the molding agent 450 may be formed of the same or different material.

A method for manufacturing a semiconductor package according to an exemplary embodiment of the present invention will be described below with reference to FIGS. 3A to 3E.

Figure 3A:
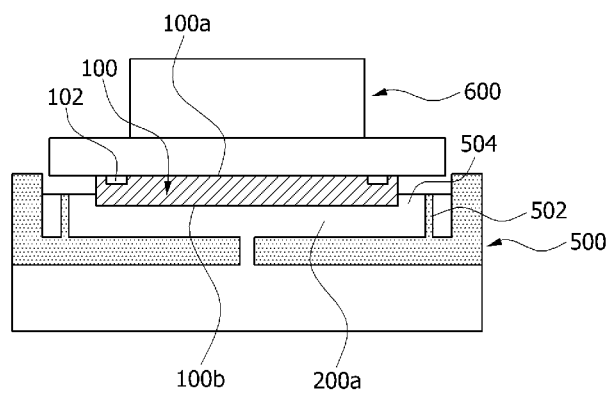
FIGS. 3A to 3E are cross-sectional views and plan views illustrating a method for manufacturing a semiconductor package according to an exemplary embodiment of the present invention.

Referring to FIG. 3A, a mold 500 including protruding bars 502 within a cavity 504 is filled with an insulation member solution 200a containing, for example, an epoxy resin, and a semiconductor chip 100 is immersed into the insulation member solution 200a by using a pickup device 600. Here, the semiconductor chip 100 has a first surface 100a on which electrode pads 102 are arranged, and a second surface 100b which is the other side of the semiconductor chip 100.

The insulation member solution 200a may be formed of any insulation material as long as it has an insulation property, a mechanical property, and a processability which are suitable for the semiconductor package. For example, the insulation member solution 200a may include acrylic polymer and may also include ultraviolet curable acrylate monomer (or oligomer), a photoinitiator, or a curing agent.

The acrylic polymer may include (meth)acrylate polymer. Example of the acrylic polymer may include methyl acrylate, ethyl acrylate, propyl acrylate, butyl acrylate, octyl acrylate, butyl methacrylate, 2-ethylhexyl methacrylate, octyl methacrylate, silicon (meth)acrylate, or fluorine (meth)acrylate. Such acrylic polymers may be used solely or in combination.

Examples of the ultraviolet curable monomer (or oligomer) include acrylate compounds, such as trimethylolpropane triacrylate, tetramethylolmethane tetraacrylate, pentaerythritol triacrylate, dipentaerythritol monohydroxy pentaacrylate, dipentaerythritol hexaacrylate, urethane acrylate, polyether and polyester acrylate, epoxy acrylate, and acrylic acrylate; however, the invention is not limited thereto.

Examples of the photoinitiator include benzyldimethylketal, hydroxycyclohexyl phenyl ketone, 4-benzyl-4'-methyldiphenylsulfide, isoprphylthioxanthone, 2-chlorothioxanthone, ethyl-4-dinnethylanninobenzoate, 2-ethylhexyl-4-dimethylaminobenzoate, 4-methylbenzophenone, 2,4,6-trimethylbenzoyl-diphenyl phosphine, 2-hydroxy-1,2-diphenyl ethanonebenzophenone, acetophenone, benzoin, benzoin methyl ether, benzoin ethyl ether, benzoin benzoic acid, and benzoin dimethyl ketal; however, the invention is not limited thereto.

The insulation member solution 200a may include an epoxy resin and may further include at least one of a curing agent, a curing accelerator, a filler, and other additive. The epoxy resin may include at least one epoxy selected from the group consisting of bisphenol epoxy, phenol novolac epoxy, cresol novolac epoxy, multifunctional epoxy, amine-based epoxy, heterocyclic containing epoxy, substituted epoxy, naphthol-based epoxy, and derivatives thereof; however, the invention is not limited thereto.

The curing agent may include at least one of an amine curing agent, an acid anhydride curing agent, a polyamide resin, a polysulfide resin, and a phenol resin; however, the invention is not limited thereto. The curing accelerator may be used to accelerate a curing reaction between the epoxy resin and the curing agent. Any material which can accelerate the curing reaction may be used as the curing accelerator. Examples of the curing accelerator include amine compounds, such as triethylamine, benzyldimethylamine, α-methylbenzyldimethylamine, and 1,8-diazabicyclo-undecen-7; imidazole compounds, such as 2-methyl-imidazole, 2-phenylimidazole, and 2-phenyl-4-methylimidazole; or organic phosphorus compounds, such as salicylic acid, phenol, triphenylphosphine, tributylphosphine, tri(p-methylphenyl)phosphine, tri(nonylphenyl)phosphine, triphenylphosphine triphenylborane, and tetraphenylphosphine tetraphenylborate. However, the invention is not limited thereto.

The filler may use one or more of an organic filler and an inorganic filler. For example, the filler may use one or more inorganic fillers selected from the group consisting of talc, sand, silica, calcium carbonate, mica, quartz, glass fiber, graphite, alumina, antimony oxide ($Sb_2O_3$), barium titanate, and bentonite, or may use an organic bead (an organic filler) composed of a phenol resin or a urea resin. In order to impart a thixotropic property to an epoxy resin, colloidal silica (aerosol) or bentonite-based argillaceous filler may be added. In order to reduce a probability of flowing down or losing of the epoxy resin during the curing process, the thixotropic imparting filler can impart a low viscosity when it is in a flowable state, and impart a high viscosity when it is in a stationary state. Hence, it is advantageous when the epoxy resin is attached to the semiconductor chip by an immersion method.

If necessary, a coloring agent such as an organic/inorganic dye, a coupling agent, or a deforming agent may be added as other additives.

Figure 3B:
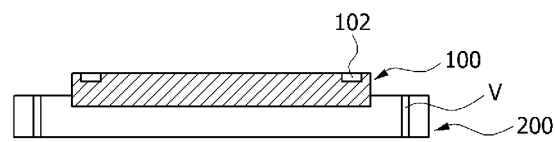
Figure 3C:
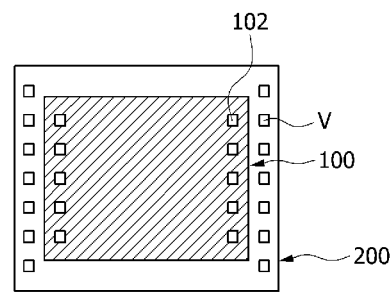

Referring to FIG. 3B and FIG. 3C which is a plan view of FIG. 3B, after the insulation member solution 200a is cured, the semiconductor chip 100 and the insulation member 200 attached thereto are separated from the mold 500. As another exemplary embodiment, the curing reaction may be performed after the insulation member solution 200a attached to the semiconductor chip 100 is separated from the mold 500. The curing reaction may be performed by a thermal curing or an ultraviolet curing. The via hole V is formed within the insulation member 200 by the protruding bar 502 arranged within the cavity of the mold 500. The semiconductor chip 100 and the insulation member 200 attached thereto may be separated using the pickup device 600 or a separate mold release device.

Figure 3D:
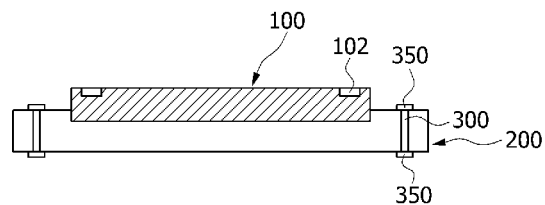

Referring to FIG. 3D, the via hole V of the insulation member 200, which is formed by the bar 502, may be filled with a conductive filler 300, and a contact pad 350 may be formed at an end or both ends of the conductive filler 300. Meanwhile, the conductive filler 300 and the contact pad 350 may be formed of different materials in different manner. Alternatively, the conductive filler 300 and the contact pad 350 may be formed of the same material at the same time.

The conductive filler may include one or more material selected from the group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr), molybdenum (Mo), and an alloy thereof; however, the invention is not limited thereto. The via hole V may be filled with the conductive filler by at least one method selected from the group consisting of a typical thin film formation method, such as a vacuum evaporation or a sputtering, an electroless plating, an electroplating, a paste injection, a paste screen printing, and an inkjet spraying; however, the invention is not limited thereto.

The via hole V may be filled by the electroless plating or electroplating. For example, a seed layer is formed by an electroless plating, a chemical vapor deposition (CVD), or a sputtering before the via hole V is filled, and then, the via hole V is filled with a metal, such as copper, by an electroless plating or electroplating.

In order to fill the via hole V by the copper electroless plating, a passivation layer may be formed of a photoresist in a region except for the via hole V, so that the conductive filler fills, for example, only the via hole V. A plating solution may include a copper ion source, a pH control agent, or a reducing agent, and may further include a complexing agent (e.g., ethylenediamine tetraacetic acid (EDTA)) or a surfactant. The copper ion source may include $CuSO_4 \cdot 5H_2O$ or $CuSO_4$, and the pH control agent may include KOH or NaOH. The reducing agent may include formaldehyde (HCHO) or glyoxylic acid. However, the invention is not limited thereto. The copper electroless plating may be performed in such a way that copper is reduced by a reducing agent (formaldehyde) as expressed in the following formula.

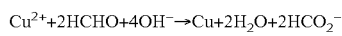

$$Cu^{2+}+2HCHO+4OH^-\rightarrow Cu+2H_2O+2HCO_2^-$$

Here, a catalyst, such as palladium (Pd) or Palladium/tin (Pd/Sn) compound, may be used. When pH is raised (about pH 10 or more) by the pH control agent, such as sodium hydroxide, a strong reducing process of formaldehyde is caused to generate electrons. These electrons may flow into copper ions, and the copper ions are precipitated by the palladium catalyst. Consequently, a copper layer may be coated.

A copper electroplating may be performed after a copper seed layer is formed by an electroless plating. As an example of the copper electroplating, an electroplating solution may include a copper ion source, sulfuric acid ($H_2SO_4$) controlling electrical conductivity, or hydrochloric acid (HCl) controlling a reduction reaction, and may further include other additives. That is, when $CuSO_4$ is put into sulfuric acid ($H_2SO_4$) and water as a copper ion source, $CuSO_4$ is decomposed into $Cu^{2+}$ ions and $SO_4^{2-}$ ions. When the seed layer is coupled to a cathode and dipped into a plating tank, the seed layer may be grown to from a copper layer.

In order to improve electrical properties, a gold electroplating may be further performed, and a nickel electroplating may be performed prior to the gold electroplating. A gold-copper component has a weak strength and thus tends to easily wear out. When gold is directly plated on copper, the gold component moves toward the copper component, and the copper component moves toward the gold component. Hence, the original object to improve the conductivity by the gold plating may not be achieved. Therefore, a nickel electroplating may be performed prior to the gold electroplating. A plating solution for the gold electroplating may include chloroaurate or gold sulfite as a gold source. A cyanic compound or a non-cyanic compound may be added as a chelating agent. However, the invention is not limited to the plating solution for the gold electroplating. A nickel surface activation process may be previously performed for helping the attachment of gold.

There is no limitation on the method of forming the nickel layer by using the electroplating. For example, an aqueous solution containing 120-230 g/L $NiSO_4 \cdot 6H_2O$, 5-35 g/L $NiCl_2$, and 5-35 g/L $H_3PO_4$ or an aqueous solution containing 120-230 g/L $NiSO_4 \cdot 6H_2O$, 10-30 g/L $Na_4Cl$, and 20-50 g/L $7H_2O$ may be used, and the nickel layer may be formed under a condition of pH 4-7. However, the invention is not limited thereto.

As another exemplary embodiment, an inkjet spraying process may be used. An ink used in the inkjet spraying process may include conductive nano powder in a solvent. When the ink is filled in the via hole and then heated, the solvent becomes evaporated and the conductive nano powder remains. As yet another exemplary embodiment, a thin film deposition process, such as a vacuum deposition, a sputtering, or a chemical vapor deposition (CVD), may be used. The nickel layer may be formed by directly injecting a paste containing a conductive metal or by using a screen printing.

The contact pad 350 may include one or more material selected from the group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr), molybdenum (Mo), and an alloy thereof. The contact pad 350 may also include other metals except for the above metals. The contact pad 350 may be formed by at least one of a typical thin film formation method, such as a vacuum evaporation or a sputtering, an electroless plating, an electroplating, a paste injection, a paste screen printing, and an inkjet spraying; however, the invention is not limited thereto.

Figure 3E:
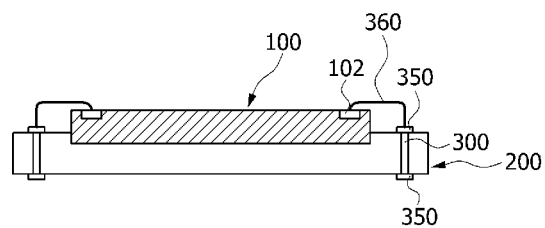
Figure 4A:
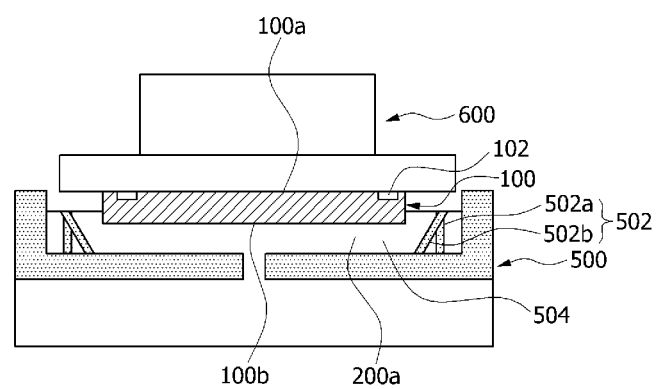
FIGS. 4A to 4D are sectional views and plan views illustrating a method for manufacturing a semiconductor package according to another exemplary embodiment of the present invention.
Figure 4B:
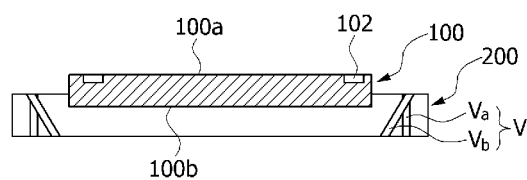
Figure 4C:
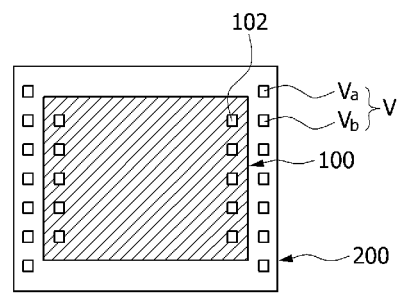
Figure 4D:
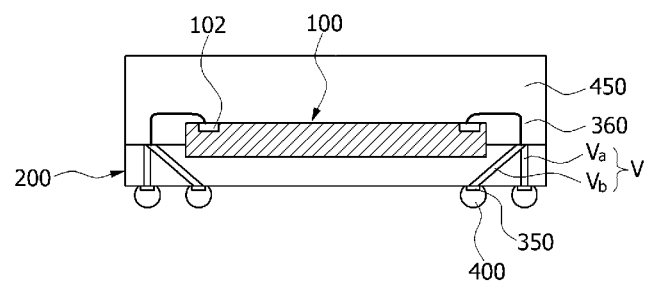

Referring to FIG. 3E, the contact pad 350 and the electrode pad 102 of the semiconductor chip may be bonded by the bonding wire 360. Then, the solder ball 400 and the molding agent 450 are formed by a typical semiconductor package process, thereby manufacturing the semiconductor package as illustrated in FIG. 2.

A method for manufacturing a semiconductor package according to another exemplary embodiment of the present invention will be described below with reference to FIGS. 4A to 4D. A duplicate description of the foregoing contents will be omitted.

Referring to FIGS. 4A to 4D, bars 502 for forming via holes within a cavity 504 of a mold 500 is formed. Regarding the bars 502, a bar 502a which is vertical to a surface 100a or the other surface 100b of a semiconductor chip 100, and a bar 502b which is not vertical thereto are mixed. Therefore, regarding the via holes V formed by the bars 502, a via hole Va which is vertical to one surface (or the other surface) of the semiconductor chip or an upper surface (or a lower surface) of an insulation member, and a via hole Vb which is not vertical thereto are mixed. That is, when a shape and/or position of the bar 502 within the cavity of the mold are/is changed, a shape and/or a position of the via hole V or a conductive filler 300 filling the via hole V are/is changed. Afterward, an attachment position of a solder ball 400 may be changed. This may very efficiently cope with a reduction in pitch which is caused as the semiconductor package becomes lightweight, slim, simple, and small-sized.

A semiconductor package and a method for manufacturing the same according to yet another exemplary embodiment of the present invention will be described below with reference to FIG. 5. A duplicate description of the foregoing contents will be omitted.

Figure 5:
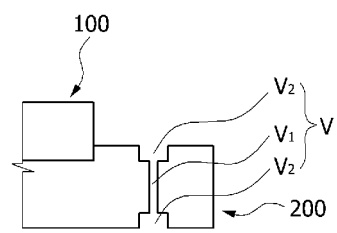
FIG. 5 is a cross-sectional view illustrating a partial structure of a semiconductor package according to yet another exemplary embodiment of the present invention.
Figure 5:
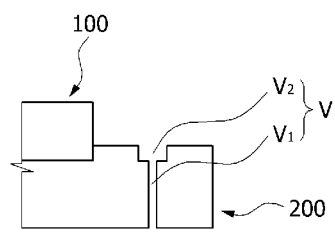
Figure 5:
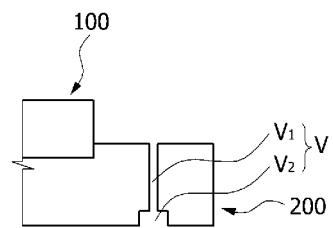
Figure 5:
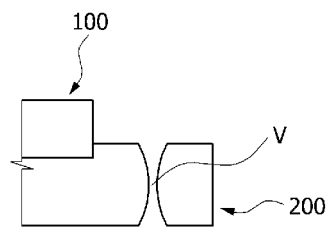

Referring to FIG. 5, a via hole V of the semiconductor package according to the exemplary embodiment of the present invention may have two or more regions, including a first region V1 and a second region V2 having a cross-sectional area different from that of the first region V1. For example, as illustrated in FIG. 5(A), the first region V1 may be located at the center of the insulation member 200, and the second region V2 may be located at both ends of the first region V1. In addition, a conductive filler filling the second region V2 may also serve as a contact pad. In this case, a separate process of forming the contact pad may be omitted. In addition, the second region V2 having a wider cross-sectional area than that of the first region V1 may be formed in the first region or at only an end of the semiconductor chip 100 of the first region V1 (see FIG. 5(B)), or the second region V2 having a wider cross-sectional area may be formed at the other end of the semiconductor chip 100 (see FIG. 5(C)). Furthermore, the via hole V may be formed so that its cross-sectional area gradually changes. For example, the via hole V may be formed so that its cross-sectional area is smallest at the center of the insulation member 200 and gradually increases toward both ends thereof (see FIG. 5(D)). Moreover, the cross-sectional area of the via hole V may have a shape of the reverse of FIG. 5. That is, the cross-sectional area of the via hole V may formed so that the cross-sectional area of the first region V1 is wider than that of the second region V2 and gradually increases toward the center of the insulation member 200.

According to the exemplary embodiments of the present invention, the known package substrate is replaced with the insulation member to thereby improve the reliability of the semiconductor package reducing defects of the product caused by warpage of the substrate and so on. Moreover, the unit cost of the semiconductor package may decrease and the quality control may become easy.

The exemplary embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for manufacturing a semiconductor package, comprising:
   filling a mold with an insulation member solution, the mold comprising a protruding bar within a cavity;
   immersing a second surface of a semiconductor chip into the insulation member solution, wherein the semiconductor chip has a first surface on which an electrode pad is arranged, and the second surface which is the other side of the semiconductor chip;
   separating the semiconductor chip and an insulation member attached thereto from the mold; and
   filling a via hole of the insulation member, which is formed by the protruding bar, with a conductive filler.

2. The method of claim 1, wherein the insulation member solution comprises an epoxy resin.

3. The method of claim 2, wherein the insulation member solution further comprises a curing agent and a curing accelerator.

4. The member of claim 2, wherein the insulation member solution further comprises a filler.

5. The method of claim 4, wherein the filler comprises one or more inorganic fillers selected from the group consisting of talc, sand, silica, calcium carbonate, mica, quartz, glass fiber, graphite, alumina, antimony oxide, barium titanate, and bentonite.

6. The method of claim 1, wherein the conductive filler comprises one or more materials selected from the group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr), molybdenum (Mo), and an alloy thereof.

7. The method of claim 1, wherein the via hole of the insulation member is filled with the conductive filler by at least one method selected from the group consisting of a vacuum evaporation, a sputtering, a chemical vapor deposition, an electroless plating, a paste injection, a screen printing, and an inkjet spraying.

8. The method of claim 1, further comprising curing the insulation member solution before the semiconductor chip and the insulation member attached thereto are separated from the mold.

9. The method of claim 8, wherein the insulation member solution is cured by a thermal curing process or an ultraviolet curing process.

10. The method of claim 1, further comprising forming a contact pad at an end or both ends of the conductive filler after the via hole of the insulation member, which is formed by the protruding bar, is filled with the conductive filler.

11. The method of claim 10, wherein the contact pad comprises one or more materials selected from the group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr), molybdenum (Mo), and an alloy thereof.

12. The method of claim 10, further comprising:
   coupling the contact pad and the electrode pad of the semiconductor chip by a bonding wire after the via hole of the insulation member, which is formed by the protruding bar, is filled with the conductive filler; and
   mounting a solder ball on the contact pad.

* * * * *